United States Patent [19]

Leebrick

[11] Patent Number: 4,566,796
[45] Date of Patent: Jan. 28, 1986

[54] METHOD OF DETERMINING POSITION ON A WAFER

[75] Inventor: David H. Leebrick, Palm Bay, Fla.

[73] Assignee: Harris Corporation, Melbourne, Fla.

[21] Appl. No.: 526,066

[22] Filed: Aug. 24, 1983

[51] Int. Cl.$^4$ .................. G01B 11/00; G01N 21/86
[52] U.S. Cl. ..................................... 356/401; 250/548
[58] Field of Search ................ 356/400, 401; 355/53; 250/557, 548

[56] References Cited

U.S. PATENT DOCUMENTS

| | | |
|---|---|---|
| 3,796,497 | 3/1974 | Mathisen et al. |
| 4,037,969 | 7/1977 | Feldman et al. ................ 356/400 |
| 4,070,117 | 1/1978 | Johannsmeier et al. .......... 356/172 |
| 4,153,371 | 5/1979 | Koizumi et al. ................ 356/400 |
| 4,167,677 | 9/1979 | Suzki ........................... 356/401 |
| 4,209,830 | 6/1980 | Arimura et al. ................ 356/399 |

OTHER PUBLICATIONS

"Automatic Wafer Alignment Technique for the 700SLR/800SLR Wafer Steppers"; J. Lauria and T. Kerekes; Sep. 30, 1980.
"Application of Zone Plates to Alignment in Microlithography"; M. Feldman, A. D. White and D. L. White; Aug. 14, 1981.
"Stepping into the 80's with Die-By-Die Alignment"; Dr. Harry L. Stover; May 1981.

Primary Examiner—R. A. Rosenberger
Assistant Examiner—Michael Vollero
Attorney, Agent, or Firm—Barnes & Thornburg

[57] ABSTRACT

An alignment system and method is provided having an alignment target pattern formed on a semiconductor wafer, with means for scanning that target pattern to produce signals representing dimensions of individual features therein and distances between adjacent features, and with means for interrogating these signals to determine the relative position and distance of the scanned portion of the target pattern from a predetermined reference position. The target pattern includes one or more series of concentric figures, each figure having a particular dimension which differs from the particular dimension of each adjacent figure by a predetermined magnitude and being spaced from adjacent figures by predetermined distances. These predetermined distances and magnitude are detected from the scanning means signals and are used to determine the distance and direction of the scanning position from a reference position.

19 Claims, 4 Drawing Figures

METHOD OF DETERMINING POSITION ON A WAFER

BACKGROUND OF THE INVENTION

The present invention relates generally to alignment targets, and more particularly to methods utilizing alignment targets in the fabrication of integrated circuits on semiconductor wafers.

The trend in fabrication of integrated circuits (ICs) has been toward increased circuit complexity and decreased specific circuit size on a larger wafer. Production processes for such ICs have often required a plurality of masks to be successively applied to a semiconductor wafer. Typically, sub-micron alignment tolerances are required between mask images. Alignment of the wafer with a predetermined reference location and/or the masks has thus become an important step, particularly in a conventional step-and-repeat projection printer. Obtaining rapid and accurate alignment between a single mask and wafer and among several masks and the wafer has been a continuing problem in IC lithography as smaller circuit sizes require smaller alignment tolerances.

Several automatic systems for obtaining high precision alignment have been proposed. Three primary means of precision optical alignment include: optical interference, for example, laser illumination of diffraction gratings; incident laser beam deflection at mask edges; and digital processing of video signals from a wafer target. The first method often involves complex and specifically dimensioned Fresnel zone plates disposed on the mask and/or the wafer. These zone plates reflect incident radiation, acting as a focusing lens to create a position indicating dot. Bright images must be reflected at every wafer level even when coated with photoresist in order for this method to work efficiently and quickly. Surface irregularities also present accuracy problems for this alignment method.

Digital processing of video signals has become a more practical, flexible, and cost effective means of wafer alignment in production of many high speed, large memory ICs. Further, this method can also now provide as much alignment precision as optical interference methods. A typical, conventional automatic wafer-to-reticle alignment system using digital processing of video signals is shown in FIG. 1. Such a system is presently commercially available in, for example, the Electromask 700 SLR/800 SLR Wafer Steppers, and only a brief description will follow herein.

Semiconductor wafer 10 is mounted beneath imaging lens system 20 and optically aligned along axis 25 with chip or die reticle 30. Projector 40 provides a light source which causes the image of reticle 30 to be reduced through lens system 20 and projected onto wafer 10 as an individual chip or die 12 at each required location.

Semiconductor wafer 10 is shown as having a plurality of individual chips or die 12 formed thereon. For convenience of description, only a few such die 12 are shown in FIG. 1, but it will be recognized by those skilled in the art that any number of die may be so formed, depending upon the size of wafer 10 and the reduction power of lens system 20. Alignment targets 15 are shown as associated with each die 12, although if alignment tolerances are large or if surface irregularities, such as wafer bow, are not a problem fewer alignment targets 15 than die 12 may be sufficient to assure global alignment. Targets 15 may be projected onto wafer 10 by any convenient, conventional means and may be positioned anywhere within associated die 12, including the scribe area, as shown in FIG. 1.

Wafer/reticle alignment is provided by a video camera 50 which views targets 15 through window 32 in reticle 30 and through lens system 20. The video signal output from video camera 50 is digitalized by high speed A/D converter 55, preprocessed in hardware unit 60, and transferred to CPU 65 to calculate positional information and issue any necessary correction signals for wafer/reticle alignment to micropositioners 70 and 72. These micropositioners may include, for example, laser interferometers. Although two micropositioners 70 and 72 are shown in FIG. 1, in some applications only a single device may be employed. Further, CPU 65, micropositioners 70 and 72, and hardware unit 60 may also be readily employed to step-and-repeat reticle images to entirely different wafer positions, rather than merely align once at a particular position.

Such prior alignment systems typically employ target patterns having vertical and horizontal lines 17 and 18, respectively, each with significant dimensions, such as line width. It is necessary to scan the absolute magnitude both of these dimensions to provide sets of data indicating vertical and horizontal positions within the target pattern. An example of such a target 15 viewed through reticle window 32 is shown in FIG. 2. Line by line intensity scans are made of the video signal output of video camera 50 and added together to give digital profiles of the absolute magnitudes of the pattern dimensions on both horizontal and vertical axis of the video signal. These digital profiles may be compared with a reference profile to determine the position of the center of reticle window 32 relative to a reference point on wafer 10, the target center, for example, and the necessary corrective signals to be issued for micropositioners 70 and/or 72 to reposition wafer 10 and/or reticle 30 to achieve alignment with that reference point. However, if wafer 10 and reticle 30 are sufficiently misaligned, the portion of target 15 seen by video camera 50 through reticle window 32 will contain either line 17 or line 18 or no line at all. Without the intersection of such horizontal and vertical lines, CPU 65 cannot determine the direction and distance of the interrogation position from a reference point, and thus cannot provide alignment correction signals to micropositioners 70 and 72.

Also while such an automatic alignment system does provide an increase in alignment speed and accuracy over prior systems, as the IC fabrication technology has progressed, the need has arisen for even faster and more accurate alignment means. Furthermore, it is desirable to provide such a system that is compatable with a wide variety of pre-existing hardware and which can detect a range of errors largely defined by the user for specific production runs.

SUMMARY OF THE INVENTION

It is an object of the present invention to provide an improved method of alignment having increased speed and accuracy.

Another object of the present invention is the provision of a means for aligning wafers in the production of IC's which is independent of the absolute line width of target pattern features.

A further object is to provide an alignment target whose dimension can be user defined to create a broad range of detectable alignment errors, and which can be used with a variety of alignment systems having different positioning characteristics.

A still further object is the provision of a method for determining relative position and direction on a semiconductor wafer by interrogating only one linear dimension of target pattern features and the distance between such features.

These and other objects of the present invention are attained in the provision of an alignment system having an alignment target pattern formed on a semiconductor wafer, with means for scanning that target pattern to produce signals representing dimensions of individual features therein and distances between adjacent features, and with means for interrogating these signals to determine the relative position and distance of the scanned portion of the target pattern from a predetermined reference position.

The target pattern includes at least one series of concentric figures or lines, each line having a particular dimension which differs from the particular dimension of each adjacent line by a unique magnitude, and each line being spaced apart from adjacent lines by predetermined distances. Plural series of concentric figures or lines may also be employed, concentric about the first series. Each line in these additional series may also have a particular dimension differing from that dimension of adjacent lines by a unique magnitude, and this unique magnitude may be the same as the unique magnitude between corresponding lines in the first series. This unique magnitude may be an increasing value between each pair of adjacent lines from the inner to outer pairs. The spacing distances between such lines may be repeated in each series and differ by predetermined amounts or integer factors between series. The center of the target pattern may be indicated by a unique geometric figure. For ease of pattern interrogation, the particular dimensions of these concentric figures may be linearly aligned horizontally or vertically.

This target pattern can be scanned by any means, including video camera, capable of determining the absolute particular dimension of a line or the difference between such particular dimensions of adjacent lines, as well as spacing distances between these adjacent lines. Signals representing this data are sent to an interrogating means, including, for example, a CPU, for analysis. Specific unique magnitudes, derived from comparing figure dimensions, may be used to indicate distances from the reference point or target center. The sign (positive or negative) of the difference between adjacent lines may be used to indicate direction with respect to the reference point. The spacing distance between adjacent lines may be used to determine which series was being scanned and, thus, how many other series lay between the scanned position and the reference point. Once this information is known, corrective signals can be sent to micropositioners to align the reticle window or scanning position with the reference point associated with the target pattern. This method provides increased speed and accuracy since signals may be scanned along only a single dimension; spacing between lines may be used to indicate misalignment directly.

Other objects, advantages and novel features of the present invention will become apparent from the following description of a preferred embodiment when considered in conjunction with the drawings.

DESCRIPTION OF A PREFERRED EMBODIMENT

Figure 1:
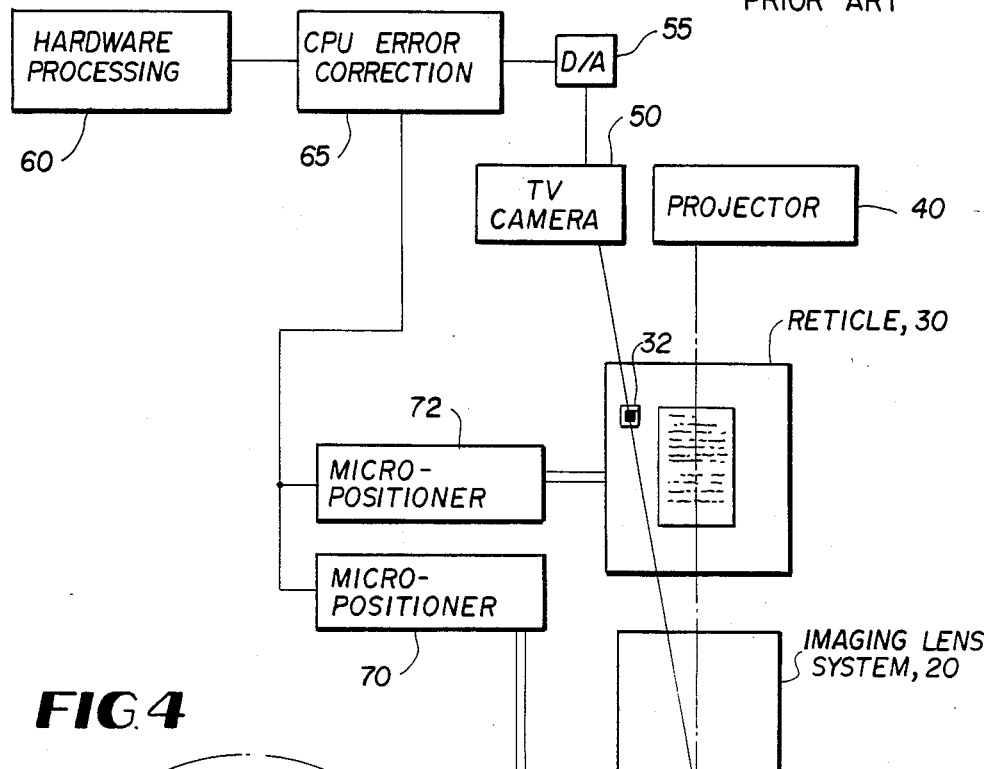
FIG. 1 shows diagramatically a conventional automatic wafer alignment system.
Figure 3:
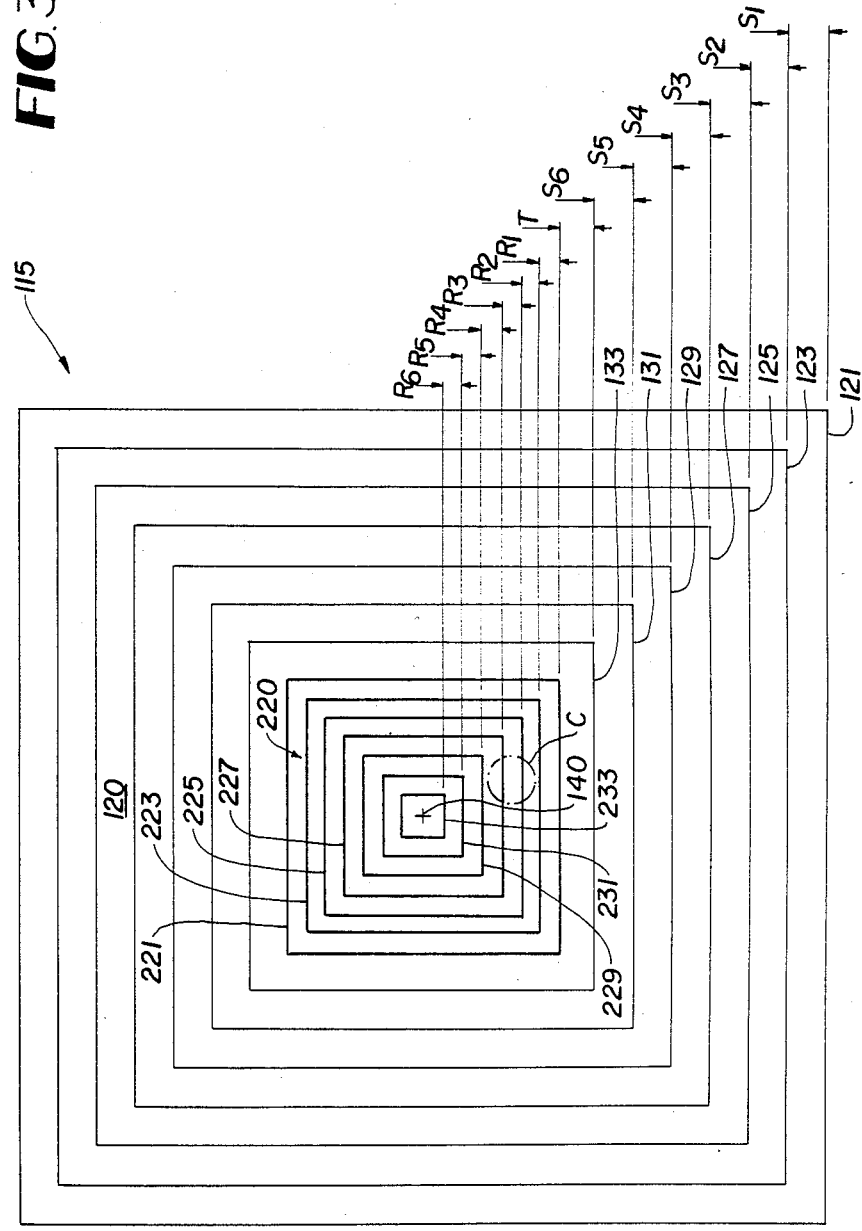
FIG. 3 shows a target pattern according to the present invention for use in the automatic wafer alignment system shown in FIG. 1.

FIG. 3, which illustrates a preferred embodiment of the present invention, shows a target pattern 115 which may be projected and/or deposited onto a semiconductor wafer, such as wafer 10 in FIG. 1, by any conventional means. Target pattern 115 may be positioned on wafer 10 at the various locations corresponding to those available for target pattern 15, i.e., at particular die locations or at strategic, wafer-wide positions, for die-by-die or global alignment, respectively. Within pattern 115 are series of concentric FIGS. 120 and 220, outer series 120 being itself concentric about inner series 220 and separated by spacing distance T. Although two such series are shown, the present invention specifically contemplates pattern having only one or three or more series, depending upon the range of detectable alignment errors desired by a particular user.

Reference point 140, may, for example, be the pattern center, and is designated by any unique geometric figure or distinctive mark, in this case a cross. Series 120 includes individual FIGS. 121, 123, 125, 127, 129, 131, and 133 spaced apart by distances $S_1$, $S_2$, $S_3$, $S_4$, $S_5$, and $S_6$ respectively, concentric about each other, and each having at least one particular dimension relative to each of the adjacent figures. Likewise, series 220 includes individual FIGS. 221 through 233 spaced apart by distances $R_1$ through $R_6$, respectively, concentric about each other and having a particular dimension relative to each of the adjacent figures. In FIG. 3, spacing distances $S_n$ and $R_m$ are each shown to be of equal distance between all pairs of adjacent figures in each of their respective series, 120 and 220. While such an arrangement simplifies positional analysis, it is not essential to the subject invention.

Figure 4:
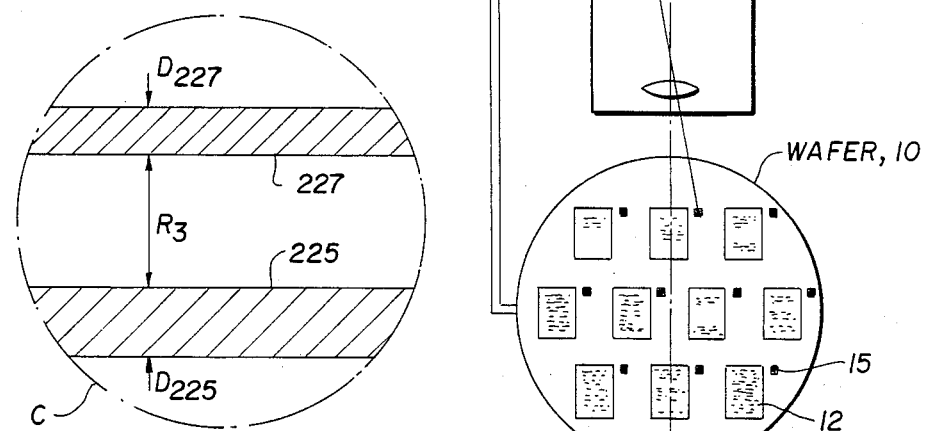
FIG. 4 shows an enlargement of that portion of the target pattern encircled at C in FIG. 3.
Figure 2:
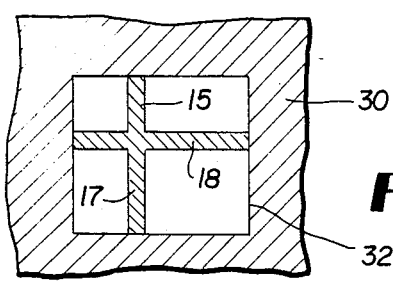
FIG. 2 shows a conventional target pattern for the automatic wafer alignment system shown in FIG. 1 when viewed through a reticle window.

In the preferred embodiment of the subject invention, the particular dimensions of FIGS. 121, 123, 125, 127, 129, 131, 133, 221, 223, 225, 227, 229, 231, 233 are the line widths, $D_{121}$, $D_{123}$, $D_{125}$, $D_{127}$, $D_{129}$, $D_{131}$, $D_{133}$, $D_{221}$, $D_{223}$, $D_{225}$, $D_{227}$, $D_{229}$, $D_{231}$, $D_{233}$ respectively. Although every line width is not specifically shown in the figures, their existance will be readily understood by those skilled in the art in light of FIG. 4. FIG. 4 shows an enlargement of this portion of target pattern 115 circled at C in FIG. 3 and illustrates more clearly representative line widths $D_{225}$ and $D_{227}$ spaced apart by distance $R_3$. The line widths shown in FIGS. 3 and 4 have predetermined values depending upon the distance of the associated line or figure from reference point 140 or the interior line of that series. For any two adjacent lines X and Y, the relative differences between their width, $(D_x - D_y)$, is, thus, of a predetermined magnitude and, if unique within a given series, may be used to indicate distance to the interior figure of that series or reference point 140. For example, if $D_{121}$ $D_{123}$, $D_{125}$, D127, D129, D131, D133 is 27.5, 23.0, 19.0, 15.5, 12.5, 10.0, and 8.0 μm, respectively, then $(D_{121}-D_{123})=4.5$, $(D_{123}-D_{125})=4.0$, $(D_{125}-D_{127})=3.5$, $(D_{127}-D_{129})=3.0$, $(D_{129}-D_{131})=2.5$, and $(D_{131}-D_{133})=2.0$ μm. Thus, determining either the absolute line width or the difference between adjacent lines will define a unique distance from a reference position. In actual practice, However, it has been found to be particularly advantageous to determine this distance from the line width differences, especially since this permits use of scanning means having a smaller field of view.

In the example given above it may be readily seen that the unique magnitude of line width differences increases linearly from innermost FIG. 133 to outermost FIG. 121. This increase defines the pitch of the series of concentric figures and may be the same between different series. If series 120 and 220 have the same pitch or unique magnitude of line width differences between corresponding pairs of adjacent lines, such as lines 121, 123 and 221, 223, then the distances between adjacent lines, $S_n$ and $R_m$, may be used to determine which series the scanning position is located in. The scanning position is that portion of the target pattern in the field of view of the scanning device, such a video camera 50 of the alignment system shown in FIG. 1.

$S_1$ through $S_6$ are predetermined spacing distances which may, in the simplest example, be of equal value within a given series 120. If the corresponding spacing distances $R_1$ through $R_6$ in another series 220 are likewise all of another value, or at least of values different from $S_1$ through $S_6$, detecting such a distance value will indicate which series the scanning position is in. If $(D_x-D_y)$ represents the distance to the interior figure of that series rather than the distance to reference point 140, knowing which series is being scanned will enable the distance to reference point 140 to be determined. Since the target configuration is known, the number of series surrounding reference point 140 and the width of each such series, as indicated by the sum of the spacing distances between figures and figure line widths, as well as the spacing distances T between series are also known. Scanning to recognize the predetermined spacing distances between figures will provide information to determine how many successive series must be included in this calculation. Further, the sign of the unique magnitude of dimensional difference (positive or negative) will indicate a direction from the scanned position to reference point 140.

For example, using the automatic alignment system shown in FIG. 1 where target 115 is substituted for target 15, the positional data acquisition sequence may be illustrated as follows. If the scanned or interrogation position is in series 120 and started on line 127, width $D_{127}$ of line 127 is determined and digitized by video scanner 50 and A/D converter 55, and forwarded to CPU 65. Next video scanner 50 is instructed to move linearly one unit space relative to wafer 10, and the scan reveals a blank area. The presense of a blank area indicates to CPU 65 that another move is necessary, so video scanner 50 is instructed to move another linear unit space relative to wafer 10 until line 125 is detected and digital information representing width $D_{125}$ is determined and sent to CPU 65. Alternatively, hardware processing 60 may provide CPU 65 only with difference in line widths $(D_{127}-D_{125})$. $(D_{127}-D_{125})$ is $-3.5$ μm in the example above. The negative sign indicates the direction of reference point 140 is from line 125 to line 127. 3.5 μm indicates there are three other figures from line 127 to interior line 133, spaced apart by known distances $S_4$ through $S_6$. The number of unit spaces wherein a blank area is scanned may indicate the width of $S_3$. Alternatively, spacing distance $S_3$ may be determined from digitized scanning information in a manner similiar to that used to determine line widths $D_{125}$ and $D_{127}$. $S_3$ also may indicate the specific series being scanned and trigger the CPU to factor in other distances, known from the target pattern dimension and stored in the system, to determine the total distance to a reference position. If this spacing is equal between all concentric figures in series 120 the memory requirements of the system the signal processing time may be decreased. Further, simplification in scanning and positional analysis will result from linearly aligning these particular dimensions along horizontal or vertical planes and causing the video scanner to follow this alignment. This may, for example, be accomplished by having $D_x$ be of constant value over the entire length of each figure X and $S_n$ or $R_m$ also be of constant value between each adjacent pair of such figures, as shown in FIGS. 3 and 4. Unlike prior alignment systems, the subject invention permits sufficient positional data to be acquired by a linearly scanning along only one direction at a particular scanning position. Since only line widths and spacing need be determined and these may be linearly aligned, two dimensional scanning is not required and the scanning means may have a narrower field of view without sacrificing data accuracy or scanning speed.

A plurality of such scans or positional interrogations will pinpoint the direction to reference point 140, being at the intersection of directional lines obtained by individual scans. Since the center of reticle window 32 may be readily determined, if it is desired to align that reticle window center with reference point 140, CPU 65 may provide the appropriate correctional signals to micropositioners 70 and 72.

Each series 120 and 220 is shown as a series of concentric squares. Obviously, it is not essential to the present invention that figures of series 120 and 220 present such similar forms. Such arrangements, like using similar spacing distances within a given series or common pitches between series, provide for simplicity and ease in pattern fabrication and processing of scanned data. However, a variety of other configurations are contemplated by the present invention. Series 120 may, for example, resemble a series of concentric circles while series 220 resembles a series of concentric triangles. Such concentric figures, with their unique particular dimensions having both horizontal and vertical components, may provide positional information in their very form. Again however, to the extent that uniformity exists, system hardware and memory requirements may be simplified and reduced and the time necessary to ascertain wafer position and/or bring about alignment shortened.

Several special scanning cases may exist, such as when the scanning position lands on the reference point or a corner on the first scan, no line or figure is in the field of view on the first scan, or moving between scans to different series. All of these situations may easily be programmed into the CPU. For example, since reference point 140 has a unique figure thereon, when this is detected by the CPU, the scanning sequence may be disabled.

The series configurations and particular dimensions of target pattern 115 may be defined by the user to allow for detecting a particular range of errors and compatability with pre-existing alignment systems. The target pattern may be scanned for positional analysis even when covered by translucent masking layers since line edges will still be detectable. As long as target pattern 115 includes a series of concentric figures having known dimensional differences and separated by known distances, CPU 65 will always be provided with data signals which allow it to determine relative position within target pattern 115. The same target pattern can be used by different alignment systems with different positioning characteristics as long as their accuracy is within the target capture range. Thus, when in the course of IC production and the wafer is moved between different mask making and/or metalizing stations, no additional target patterns are required. Target capture range may be extended by increasing the number of figures within a series or by increasing the number of series in a target pattern.

While a preferred embodiment of the present invention has been described above in detail, it is to be clearly understood that the same is by way of illustration and example only. The spirit and scope of the present invention are to be limited only by the appended claims. Those skilled in the art will recognize that many modifications of the present invention are available without departing from the scope of these claims.

What is claimed is:

1. A method for determining relative position and direction on a wafer comprising:
   providing a target pattern on said wafer, said target pattern including at least one series of concentric figures, each of said figures having a particular dimension such that the difference between such particular dimensions of each pair of adjacent figures may be represented by a unique magnitude;
   scanning said target pattern so as to determine said particular dimension of a first figure and the corresponding particular dimension of a second adjacent figure; and
   determining the sign and magnitude of the difference of said first and corresponding particular dimensions with respect to said first figure and providing signals indicative of the position of said first figure with respect to a reference point in said target pattern from said determined sign and magnitude.

2. The method for determining relative position and direction according to claim 1 providing also a second series of concentric figures, and wherein said unique magnitude representing the difference between dimensions of adjacent figures in the first series is repeated in the difference between dimensions of corresponding adjacent figures in said second series.

3. The method for determining relative position and direction according to claim 2 providing further that said first and second series of concentric figures form concentric squares, said second series is concentric about the first series, and said reference point has a unique geometric configuration.

4. The method for determining relative position and direction according to claim 2 providing further the spacing between adjacent figures in said second series distinct from the spacing between corresponding adjacent figures in said first series, and the spacing between sets of adjacent lines constant throughout each of said series; and determining which series is being scanned, by detecting said spacing, to provide signals indicative of the position of that portion of said pattern being scanned with respect to said reference point.

5. The method for determining relative position and spacing according to claim 2 providing further each of figures in said first and second series has a portion extending in a horizontal or vertical dimension which comprises said particular dimensions.

6. A target pattern for acquiring positional data from a wafer comprising:
   a first and a second concentric series of concentric geometric figures, each of said figures in each of said series being spaced from adjacent figures by a predetermined amount and having at least one dimension whose differences in magnitude, with respect to corresponding dimension of adjacent figures, represents unique values and increases from the inner to the outer pair of adjacent figures;
   said differences in magnitude being repeated in corresponding pairs of both of said series such that said increase in said differences in magnitude is also repeated in both of said series; and
   said spacing from adjacent figures being distinct between corresponding adjacent figures of each of said series.

7. The target pattern according to claim 6 wherein said differences in magnitude increase linearly, and wherein said predetermined amount by which each of said figures is spaced from adjacent figures is constant and equal for and between each pair of figures in each of said first and second series.

8. The target pattern according to claim 6 wherein said dimension is the line width of each of said figures and said differences in magnitude represent the differences in line widths between adjacent pairs of said concentric figures.

9. The target pattern according to claim 7 wherein said predetermined amount corresponding to said second series is an integar multiple of said predetermined amount corresponding to said first series.

10. A system for determining the relative position and direction with respect to a reference point on a wafer comprising:
    means for providing a target pattern on said wafer, said pattern including a first series of concentric figures formed so as to include adjacent lines spaced apart by predetermined distances and each of said adjacent lines having a unique dimension such that the difference between such dimensions of said adjacent lines is of a predetermined magnitude and;
    means for scanning said pattern and detecting said adjacent lines;
    means for measuring said unique dimension of a pair of said adjacent lines and determining therefrom said predetermined magnitude; and
    means for determining said predetermined distances with respect to scanning positions within said first series of concentric figures from said predetermined magnitude.

11. The system for determining relative position and direction according to claim 10 wherein said target pattern includes a second series of concentric figures concentric about said first series and also having adjacent lines spaced apart by second predetermined distances and each of these adjacent lines also having a unique dimension such that the difference between such dimensions of said adjacent lines of said second series is of a second predetermined magnitude, and further including means for determining said second predetermined distances and magnitudes with respect to said second series.

12. The system for determining relative position and direction according to claim 11 wherein said predetermined distances between all of said adjacent lines are of the same value in each of said first and second series, the second predetermined distances of said second series are of a different value than the predetermined distances of said first series, and means are provided to compare said predetermined distances of said first and second series so as to indicate whether particular scanning positions are within said first or second series.

13. The system for determining relative position and direction according to claim 11 wherein said predetermined magnitudes representing the differences in said dimensions of said adjacent lines change continuously from the inner to the outer pairs of such adjacent lines in both of said first and second series, and means are provided to determine particular positions within said series from said predetermined magnitudes.

14. The system for determining relative position and direction according to claim 11 wherein change in said predetermined magnitudes is a linear increase from the predetermined magnitude corresponding with the innermost pair of said adjacent lines of said series, and said linear increase is of equal value between corresponding pairs of adjacent lines in said first and second series.

15. The system for determining relative position and direction according to claim 11 wherein said unique dimension is the width of each of said adjacent lines such that said predetermined magnitude is the difference in widths of a pair of said adjacent lines.

16. The system for determining relative position and direction according to claim 14 wherein said reference point has a unique geometric pattern thereon, and means are provided to detect said unique geometric pattern and indicate when a particular scanning position includes said reference point.

17. The system for determining relative position and direction according to claim 16 wherein said predetermined distances between all of said adjacent lines are of the same value in each of first and second series, the predetermined distances of said second series is a different value than the predetermined distances of said first series, and means are provided to compare said predetermined distances of said first and seconds series so as to indicate whether particular scanning positions are within said first or second series.

18. The alignment method according to claim 17 wherein said scanned portion of said target pattern is defined by a window on said reticle.

19. A method for aligning a wafer and reticle for fabrication of integrated circuits comprising:
providing a target pattern on said wafer, said target pattern including at least one series of concentric figures spaced apart by predetermined distances and each of said figures having a particular dimension of unique relative magnitude;
scanning a portion within said target pattern so as to create data signals indicating said predetermined spacing distances and said unique relative magnitudes; and
forwarding said data signals to alignment control means which issues correction signals to a means for positioning said reticle relative to said wafer to align said wafer and said reticle as a function of the difference of said unique relative magnitude of adjacent figures and said predetermined spacing distances.

* * * * *